United States Patent
Kamijima

(10) Patent No.: US 6,838,384 B2
(45) Date of Patent: Jan. 4, 2005

(54) THIN-FILM PATTERNING METHOD, MANUFACTURING METHOD OF THIN-FILM DEVICE AND MANUFACTURING METHOD OF THIN-FILM MAGNETIC HEAD

(75) Inventor: Akifumi Kamijima, Tokyo (JP)

(73) Assignee: TDK Corporation, Tokyo (JP)

( * ) Notice: Subject to any disclaimer, the term of this patent is extended or adjusted under 35 U.S.C. 154(b) by 471 days.

(21) Appl. No.: 09/781,226

(22) Filed: Feb. 13, 2001

(65) Prior Publication Data

US 2001/0019036 A1 Sep. 6, 2001

(30) Foreign Application Priority Data

Feb. 21, 2000 (JP) ........................................ 2000/042789

(51) Int. Cl.$^7$ ...................... H01L 21/311; H01L 21/302
(52) U.S. Cl. ........................................ 438/702; 438/704
(58) Field of Search ................................ 438/689–706; 216/22

(56) References Cited

U.S. PATENT DOCUMENTS

| | | | | |
|---|---|---|---|---|
| 4,608,129 A | * | 8/1986 | Tamamura et al. | 205/50 |
| 4,734,174 A | * | 3/1988 | Venis, Jr. | 205/52 |
| 4,835,083 A | * | 5/1989 | Sakai et al. | 430/130 |
| 4,908,299 A | * | 3/1990 | Ogawa | 430/323 |
| 4,925,774 A | * | 5/1990 | Barraud et al. | 430/296 |
| 5,028,938 A | * | 7/1991 | Soga et al. | 346/155 |
| 5,139,922 A | * | 8/1992 | Watanabe et al. | 430/296 |
| 5,250,388 A | * | 10/1993 | Schoch et al. | 430/269 |
| 5,288,368 A | * | 2/1994 | DeMarco et al. | 216/66 |
| 5,403,680 A | * | 4/1995 | Otagawa et al. | 429/213 |
| 5,427,841 A | * | 6/1995 | De Leeuw et al. | 428/209 |
| 5,560,870 A | * | 10/1996 | Watanabe et al. | 252/500 |
| 5,614,336 A | * | 3/1997 | Mikami et al. | 430/5 |
| 5,641,715 A | * | 6/1997 | Okamoto | 438/669 |
| 5,776,659 A | * | 7/1998 | Watanabe et al. | 430/296 |
| 5,783,363 A | * | 7/1998 | Thomas | 430/296 |
| 5,837,423 A | * | 11/1998 | Okamoto | 430/296 |
| 5,885,711 A | * | 3/1999 | Clarisse et al. | 428/407 |
| 6,045,977 A | * | 4/2000 | Chandross et al. | 430/311 |
| 6,068,000 A | * | 5/2000 | Tanabe et al. | 134/1.3 |
| 6,080,681 A | * | 6/2000 | Tabara | 438/734 |
| 6,087,270 A | * | 7/2000 | Reinberg et al. | 438/736 |
| 6,140,009 A | * | 10/2000 | Wolk et al. | 430/200 |

FOREIGN PATENT DOCUMENTS

| | | |
|---|---|---|
| JP | 63-254729 A | 10/1988 |
| JP | 6-250381 A | 9/1994 |
| JP | 7-74076 A | 3/1995 |
| JP | 11-92971 A | 4/1999 |

* cited by examiner

Primary Examiner—Nadine G. Norton
Assistant Examiner—Matthew Anderson
(74) Attorney, Agent, or Firm—Burns, Doane, Swecker & Mathis, L.L.P.

(57) ABSTRACT

A method of patterning a thin film includes a step of forming at least one strippable conductive film on a surface of a thin film to be patterned, a step of forming a mask on the at least one strippable conductive film, a step of patterning the thin film to be patterned by dry etching using the mask, and a step of removing the at least one strippable conductive film.

13 Claims, 3 Drawing Sheets

NORMAL OPTICAL EXPOSURE

THIN-FILM PATTERNING METHOD, MANUFACTURING METHOD OF THIN-FILM DEVICE AND MANUFACTURING METHOD OF THIN-FILM MAGNETIC HEAD

FIELD OF THE INVENTION

The present invention relates to a method of patterning a thin film by using a dry etching technique or patterning a resist film by using an electron beam (EB) writing or pattern generation technique, to a method of manufacturing a thin-film device using this patterning method, and to a method of manufacturing a thin-film magnetic head using this patterning method.

DESCRIPTION OF THE RELATED ART

FIGS. 1a to 1g illustrate processes, in a conventional thin-film patterning method, of forming a resist pattern on a thin-film to be patterned by using an EB writing device and of dry etching the thin-film using the resist pattern as a mask.

First, on a substrate 10 shown in FIG. 1a, a thin film to be patterned 11 is deposited by for example sputtering as shown in FIG. 1b.

Then, as shown in FIG. 1c, after a resist film 12 for EB writing is coated on the thin film to be patterned 11, desired regions to be remained of the resist film 12 are radiated with EB from the EB writing device.

Then, as shown in FIG. 1d, the radiated resist film is developed by a developing solution and thus a patterned resist film 12' is obtained.

The above-mentioned resist-patterning process is applicable in case that the resist film 12 is made of a negative type resist material. If a positive type resist material is used, portions of the resist film other than desired regions to be remained are radiated with EB.

Thereafter, as shown in FIG. 1e, dry etching such as ion milling or reactive ion etching (RIE) is performed with respect to the thin film to be patterned 11 using the patterned resist film 12' as an etching mask and thus a patterned thin film 11' is obtained as shown in FIG. 1f.

Then, as shown in FIG. 1g, the patterned resist mask 12' is removed by an organic solvent to remain only the patterned thin film 11'.

However, according to the above-mentioned conventional resist patterning method using the EB writing device, if the resist film 12 is radiated with EB, the thin film to be patterned 11 under the film 12 may be breakdown by electrostatic charge causing an entire loss of its inherent characteristics due to a high EB acceleration voltage of for example 50 kV. Particularly, this tendency is strong in case that a thin film to be patterned is a multi-layered structure thin film such as a giant magnetoresistive effect (GMR) thin-film used in a thin-film magnetic head. Therefore, it is quite difficult to use the EB writing technique in a resist patterning process of such multi-layered structure thin film.

Even if a charge-prevention film is formed on the resist film 12, it is difficult to prevent the thin film to be patterned 11 from breakdown by electrostatic charge due to radiation of EB.

If the resist film 12 is patterned by using an optical patterning technique, the breakdown due to static charge will not occur during the resist patterning process. However, during a dry etching process performed after the resist patterning process, the thin film to be patterned 11 may sometimes be breakdown by electrostatic charge causing an entire loss of its inherent characteristics. Particularly, this tendency is strong in case that a thin film to be patterned is a multi-layered structure thin film such as a GMR thin-film. This is because bias voltage and/or charge of etching ions may be applied to the thin film to be patterned 11 during dry etching.

SUMMARY OF THE INVENTION

It is therefore an object of the present invention to provide a thin-film patterning method, a method of manufacturing a thin-film device and a method of manufacturing a thin-film magnetic head, whereby a substrate, a film or a thin film to be patterned on which a resist pattern is formed can be prevented from being damaged due to electrostatic charge applied by EB.

Another object of the present invention is to provide a thin-film patterning method, a method of manufacturing a thin-film device and a method of manufacturing a thin-film magnetic head, whereby a thin film to be patterned can be prevented from being damaged due to electric charge applied by dry etching.

According to the present invention, a method of patterning a thin film includes a step of forming at least one strippable conductive film on a surface of a thin film to be patterned, a step of forming a mask on the at least one strippable conductive film, a step of patterning the thin film to be patterned by dry etching using the mask, and a step of removing the at least one strippable conductive film. In a method of manufacturing a thin-film device and in a method of manufacturing a thin-film magnetic head, at least a part of a thin-film pattern is fabricated by using this thin-film patterning method.

After the strippable conductive film is formed on the thin film to be patterned and then the mask is formed on the strippable conductive film, the dry etching is performed. Thus, electric charge due to the bias and/or charged ions of the dry etching will escape to the strippable conductive film, and therefore the thin film to be patterned will never be damaged by electrostatic discharge.

It is preferred that the at least one strippable conductive film is a conductive organic film.

It is also preferred that the at least one strippable conductive film is an insulating organic film and a conductive film such as a metallic material film or a conductive organic film, formed on the insulating organic film. In this case, preferably, the mask is formed by forming a resist film on the conductive film and then by patterning the resist film using EB writing method.

It is preferred that the conductive film is a grounded film. If the conductive film is grounded, more reliable prevention of the breakdown due to electrostatic discharge can be expected.

According to the present invention, also, a method of patterning a thin film includes a step of forming at least an insulating organic film and a conductive film on a surface on which a resist pattern is to be formed, a step of forming a resist film on the conductive film, and a step of patterning the resist film using EB writing method.

Since such the two layers is deposited on a surface on which a resist pattern is to be formed, charge due to EB will escape to the conductive film resulting that the thin film to be patterned will never be charged and a breakdown of this thin film due to electrostatic discharge can be effectively prevented. Thus, the EB writing method can be adopted to form a resist pattern on a thin film and therefore it is possible to greatly increase resolution of patterning and to extremely improve the patterning precision.

According to the present invention, furthermore, a method of patterning a thin film includes a step of forming at least an insulating organic film and a conductive film on a surface of a thin film to be patterned, a step of forming a resist film on the conductive film, a step of patterning the resist film using EB writing method, a step of patterning the thin film to be patterned by dry etching using the patterned resist film as a mask, and a step of removing the at least insulating organic film and conductive film.

After depositing such the two layers on the thin film to be patterned and the resist film is deposited on the two layers, the resist film is cured for patterning by EB writing. Thus, charge due to EB will escape to the conductive film resulting that the thin film to be patterned will never be charged and a breakdown of this thin film due to electrostatic discharge can be effectively prevented. Therefore, the EB writing method can be adopted to form a resist pattern on a thin film and then it is possible to greatly increase resolution of patterning and to extremely improve the patterning precision.

It is preferred that the conductive film is a metallic material film or a conductive organic film.

Preferably, the conductive film is a grounded film. If the conductive film is grounded, more reliable prevention of the breakdown due to electrostatic discharge can be expected.

Further objects and advantages of the present invention will be apparent from the following description of the preferred embodiments of the invention as illustrated in the accompanying drawings.

DESCRIPTION OF THE PREFERRED EMBODIMENTS

FIGS. 2a to 2i illustrate processes of a thin-film patterning in a preferred embodiment according to the present invention. In this embodiment, a resist film is cured by EB to form a resist pattern and then a thin film to be patterned is patterned by using the formed resist pattern. The thin film to be patterned may be any film applicable in a thin-film device. In a thin-film magnetic head, the thin film to be patterned may be a thin film of a magnetic pole, or a thin film or a multi-layered film of a magnetoresistive effect (MR) element for example.

Figure 1A:
FIGS. 1a to 1g, already described, show sectional views illustrating processes of a conventional method of patterning a resist film by using EB and of patterning a thin film to be patterned by dry etching.
Figure 1B:
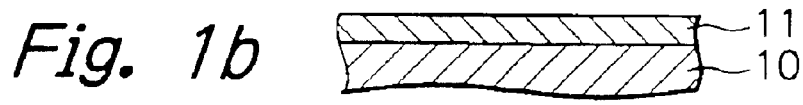
Figure 1C:
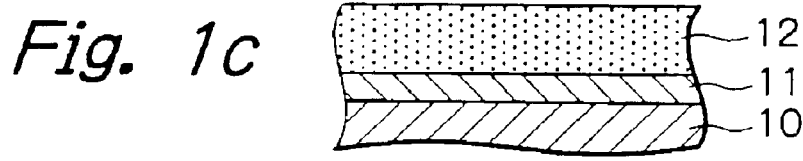
Figure 1D:
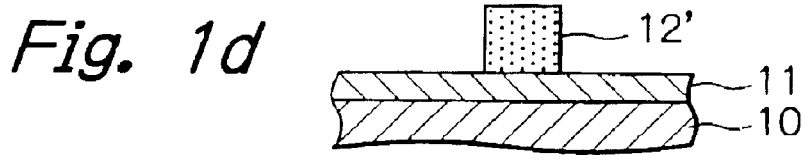
Figure 1E:
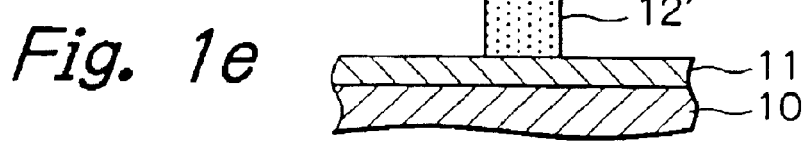
Figure 1F:
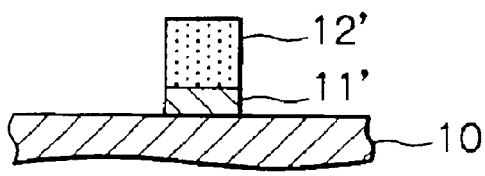
Figure 1G:
Figure 2A:
FIGS. 2a to 2i show sectional views illustrating processes of a thin-film patterning in a preferred embodiment according to the present invention.
Figure 2B:

As shown in FIG. 2a, first, a substrate or an under layer 20 on which a thin film to be patterned will be formed is prepared. On this substrate or under layer 20, a thin film to be patterned 21 is deposited by sputtering for example as shown in FIG. 2b.

Figure 2C:
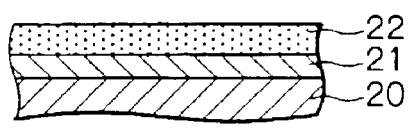
Figure 2D:
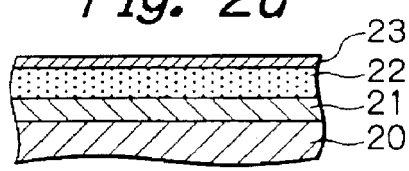

Then, as shown in FIG. 2c, an insulating organic film 22 as a strippable film is coated on the thin film 21, and, as shown in FIG. 2d, a conductive film 23 is formed on the film 22 by sputtering or coating.

Figure 2E:
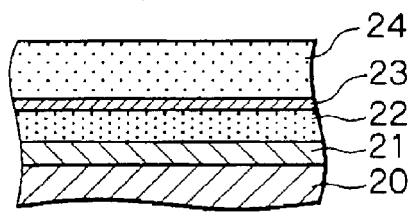

Thereafter, as shown in FIG. 2e, a resist film 24 for EB writing is coated on the conductive film 23 and then desired regions to be remained of the resist film 24 are radiated with EB from the EB writing device.

Figure 2F:
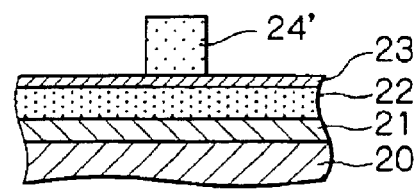

Then, as shown in FIG. 2f, the radiated resist film is developed by a developing solution and thus a patterned resist film 24' is obtained.

The above-mentioned resist-patterning process is applicable in case that the resist film 24 is made of a negative type resist material. If a positive type resist material is used, portions of the resist film other than desired regions to be remained are radiated with EB.

Figure 2G:
Figure 2G:
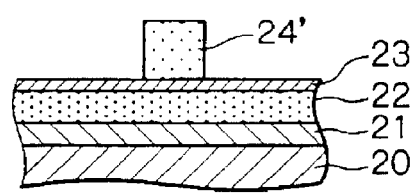
Figure 2H:
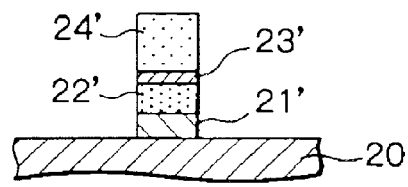

Thereafter, as shown in FIG. 2g, dry etching such as ion milling using Ar ions or RIE using Ar ions is performed with respect to the thin film to be patterned 21 using the patterned resist film 24' as an etching mask, so that a patterned conductive film 23', a patterned insulating organic film 22' and a patterned thin film 21' are obtained as shown FIG. 2h.

Figure 2I:

Then, the patterned insulating organic film 22' is melted by an organic solvent to remove this melted film 22' and also the patterned conductive film 23' and the resist film 24' on the film 22'. As a result, as shown in FIG. 2i, only the patterned thin film 21' is remained.

The strippable film is not limited to the aforementioned insulating organic film. Any film is applicable as the strippable film if it can be formed as a thin film by coating for example and melted by an organic solvent. For example, a conductive organic film which will be mentioned later is applicable.

As for the insulating organic film 22, an organic resin film material such as resist film material may be used. More specifically, the resist film material may be negative resist materials such as polyglycidyl methacrylate, polymer of glycidyl methacrylate and ethyl acrylate, chloromethylation polystyrene, polyvinylphenol and azide compound, and novolak resin with cross linking agent and acid generating agent, or positive resist materials such as polymethyl methacrylate, poly(butene-1-sulfone), novolak resin with solubilizing inhibitor of for example PMPS (poly(2-methylpentene-1-sulfone), poly(2,2,2-trifluoroethyl-2-chloroacrylate), copolymer of α-methyl styrene and α-chloro acrylic acid, and novolak resin with quinonediazide.

As for the conductive film 23, any kind of metallic film material may be used. Instead of the metallic film material, carbon film material or conductive organic film material may be used. More specifically, the conductive organic film material may be poly(isothianaphthenedil sulfonate), TCNQ chain polymer, poly(3-thienylalkanesulfonic acid compound), or ammoniate of polyaniline sulfonate.

According to this embodiment, after depositing two layers of the insulating organic film 22 that is the strippable film and the conductive film 23 on the thin film to be patterned 21, the resist film 24 is deposited on the two layers and then the resist film 24 is cured for patterning by EB writing. Thus, electric charge due to the EB will escape to the conductive film 23 with a larger area, and therefore the thin film to be patterned 21 will never be charged resulting that a breakdown of the thin film 21 due to electrostatic discharge can be effectively prevented. As a result, since the EB writing method can be adopted to form a resist pattern on a thin film, it is possible to greatly increase resolution of patterning and to extremely improve the patterning precision.

In addition, after depositing the two layers of the insulating organic film 22 and the conductive film 23 on the thin film to be patterned 21 and the resist film 24 is patterned, the dry etching is performed. Thus, electric charge due to the bias and/or charged ions of the dry etching will escape to the conductive film 23 with a larger area, and therefore the thin film to be patterned 21 will never be charged resulting that a breakdown of the thin film 21 due to electrostatic discharge can be effectively prevented.

If the conductive film 23 is grounded, more reliable prevention of the breakdown due to electrostatic discharge can be expected.

In the aforementioned embodiment of FIGS. 2a to 2i, the two layers of the insulating organic film 22 and the conductive film 23 are deposited on the thin film to be patterned 21 and then the resist pattern is formed on the two layers. However, in modification, an additional film may be deposited on the two layer and then the resist pattern is formed on the two layers. Furthermore, in another modification, a charge-prevention film may be formed over the resist film 24 and then the radiation of EB is executed.

FIGS. 3a to 3i illustrate processes of a thin-film patterning in another embodiment according to the present invention. In this embodiment, a resist film is cured by a normal optical exposure to form a resist pattern and then a thin film to be patterned is patterned by using the formed resist pattern. The thin film to be patterned may be any film applicable in a thin-film device. In a thin-film magnetic head, the thin film to be patterned may be a thin film of a magnetic pole, or a thin film or a multi-layered film of a MR element for example.

Figure 3A:
FIGS. 3a to 3i show sectional views illustrating processes of a thin-film patterning in another embodiment according to the present invention.
Figure 3B:

As shown in FIG. 3a, first, a substrate or an under layer 30 on which a thin film to be patterned will be formed is prepared. On this substrate or under layer 30, a thin film to be patterned 31 is deposited by sputtering for example as shown in FIG. 3b.

Figure 3C:
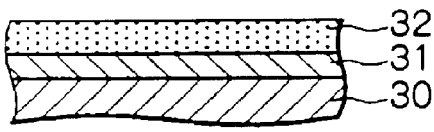
Figure 3D:
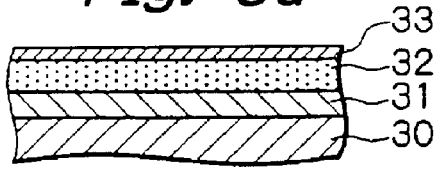

Then, as shown in FIG. 3c, an insulating organic film 32 as a strippable film is coated on the thin film 31, and, as shown in FIG. 3d, a conductive film 33 is formed on the film 32 by sputtering or coating.

Figure 3E:
Figure 3E:
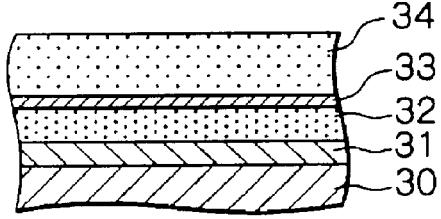

Thereafter, as shown in FIG. 3e, a resist film 34 is coated on the conductive film 33 and then desired regions to be remained of the resist film 34 are exposed by an optical exposure device using an exposure mask.

Figure 3F:
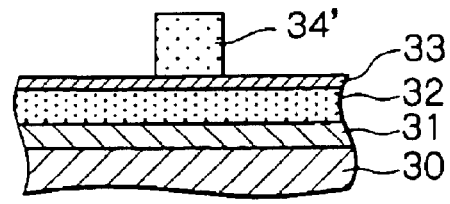

Then, as shown in FIG. 3f, the exposed resist film is developed by a developing solution and thus a patterned resist film 34' is obtained.

The above-mentioned resist-patterning process is applicable in case that the resist film 34 is made of a negative type resist material. If a positive type resist material is used, portions of the resist film other than desired regions to be remained are exposed.

Figure 3G:
Figure 3G:
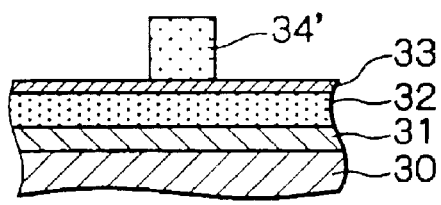
Figure 3H:
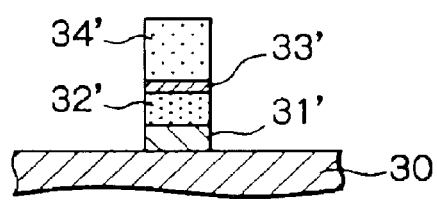

Thereafter, as shown in FIG. 3g, dry etching such as ion milling using Ar ions or RIE using Ar ions is performed with respect to the thin film to be patterned 31 using the patterned resist film 34' as an etching mask, so that a patterned conductive film 33', a patterned insulating organic film 32' and a patterned thin film 31' are obtained as shown FIG. 3h.

Figure 3I:
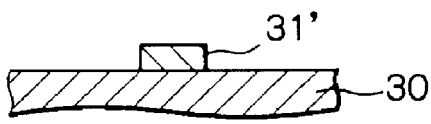

Then, the patterned insulating organic film 32' is melted by an organic solvent to remove this melted film 32' and also the patterned conductive film 33' and the resist film 34' on the film 32'. As a result, as shown in FIG. 3i, only the patterned thin film 31' is remained.

The strippable film is not limited to the aforementioned insulating organic film. Any film is applicable as the strippable film if it can be formed as a thin film by coating for example and melted by an organic solvent. For example, a conductive organic film which will be mentioned later is applicable.

As for the insulating organic film 32, an organic resin film material such as resist film material may be used. More specifically, the resist film material may be negative resist materials such as polyglycidyl methacrylate, polymer of glycidyl methacrylate and ethyl acrylate, chloromethylation polystyrene, polyvinylphenol and azide compound, and novolak resin with cross linking agent and acid generating agent, or positive resist materials such as polymethyl methacrylate, poly(butene-1-sulfone), novolak resin with solubilizing inhibitor of for example PMPS (poly(2-methylpentene-1-sulfone), poly(2,2,2-trifluoroethyl-2-chloroacrylate), copolymer of α-methyl styrene and α-chloro acrylic acid, and novolak resin with quinonediazide.

As for the conductive film 33, any kind of metallic film material may be used. Instead of the metallic film material, carbon film material or conductive organic film material may be used. More specifically, the conductive organic film material may be poly(isothianaphthenedil sulfonate), TCNQ chain polymer, poly(3-thienylalkanesulfonic acid compound), or ammoniate of polyaniline sulfonate.

According to this embodiment, after depositing the two layers of the insulating organic film 32 and the conductive film 33 on the thin film to be patterned 31 and the resist film 34 is patterned, the dry etching is performed. Thus, electric charge due to the bias and/or charged ions of the dry etching will escape to the conductive film 33 with a larger area, and therefore the thin film to be patterned 31 will never be charged resulting that a breakdown of the thin film 31 due to electrostatic discharge can be effectively prevented.

If the conductive film 33 is grounded, more reliable prevention of the breakdown due to electrostatic discharge can be expected.

In the aforementioned embodiment of FIGS. 3a to 3i, the two layers of the insulating organic film 32 and the conductive film 33 are deposited on the thin film to be patterned 31 and then the resist pattern is formed on the two layers. However, in modification, an additional film may be deposited on the two layer and then the resist pattern is formed on the two layers. Also, in another modification, only a single strippable conductive film may be deposited on the substrate and then the patterning of the resist film is performed. In a further modification, a charge-prevention film may be formed over the resist film 34 and then the patterning of the resist film is executed.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method of patterning a thin film comprising the steps of:

forming an insulating organic film that is strippable by an organic solvent on a surface of a thin film to be patterned;

forming a conductive film on said insulating organic film;

forming a mask on said conductive film; p1 patterning said thin film to be patterned by dry etching using said mask; and removing said conductive film and said mask by removing said insulating organic film using an organic solvent.

2. The method as claimed in claim 1, wherein said mask is formed by forming a resist film on said conductive film and then by patterning said resist film using an electron beam writing method.

3. The method as claimed in claim 1, wherein said conductive film is a metallic material film.

4. The method as claimed in claim 1, wherein said conductive film is a conductive organic film.

5. The method as claimed in claim 1, wherein said conductive film is a grounded film.

6. A method of manufacturing a thin-film device, at least a part of a thin-film pattern being fabricated by using a thin-film patterning method, said thin film patterning method comprising the steps of:

forming an insulating organic film that is strippable by an organic solvent on a surface of a thin film to be patterned;

forming a conductive film on said insulating organic film;

forming a mask on said at least one strippable conductive film;

patterning said thin film to be patterned by dry etching using said mask; and removing said conductive film and said mask by removing said insulating organic film using an organic solvent.

7. A method of manufacturing a thin-film magnetic head, at least a part of a thin-film pattern being fabricated by using a thin-film patterning method, said thin film patterning method comprising the steps of:

forming an insulating organic film that is strippable by an organic solvent on a surface of a thin film to be patterned;

forming a conductive film on said insulating organic film;

forming a mask on said conductive film;

patterning said thin film to be patterned by dry etching using said mask; and removing said conductive film and said mask by removing said insulating organic film using an organic solvent.

8. A method of patterning a thin film comprising the steps of:

forming at least an insulating organic film that is strippable by an organic solvent and a conductive film on a surface of a thin film to be patterned;

forming a resist film on said conductive film;

patterning said resist film using an electron beam writing method;

patterning said thin film to be patterned by dry etching using said patterned resist film as a mask; and removing said conductive film and said mask by removing said at least insulating organic film using an organic solvent.

9. The method as claimed in claim 8, wherein said conductive film is a metallic material film.

10. The method as claimed in claim 8, wherein said conductive film is a conductive organic film.

11. The method as claimed in claim 8, wherein said conductive film is a grounded film.

12. A method of manufacturing a thin-film device, at least a part of a thin-film pattern being fabricated by using a thin-film patterning method, said thin film patterning method comprising the steps of:

forming at least an insulating organic film that is strippable by an organic solvent and a conductive film on a surface of a thin film to be patterned;

forming a resist film on said conductive film;

patterning said resist film using an electron beam writing method;

patterning said thin film to be patterned by dry etching using said patterned resist film as a mask; and removing said conductive film and said mask by removing said at least insulating organic film using an organic solvent.

13. A method of manufacturing a thin-film magnetic head, at least a part of a thin-film pattern being fabricated by using a thin-film patterning method, said thin film patterning method comprising the steps of:

forming at least an insulating organic film that is strippable by an organic solvent and a conductive film on a surface of a thin film to be patterned;

forming a resist film on said conductive film;

patterning said resist film using an electron beam writing method;

patterning said thin film to be patterned by dry etching using said patterned resist film as a mask; and removing said and conductive film and said mask by removing said at least insulating organic film using an organic solvent.

* * * * *